United States Patent
Zhou et al.

(10) Patent No.: US 10,711,089 B2
(45) Date of Patent: Jul. 14, 2020

(54) UV EPOXY RESIN INSTILLATION MOLDING METHOD AND APPLICATION THEREOF

(71) Applicant: CollTech (Dongguan) Bonding Technology Co., Ltd., Dongguan (CN)

(72) Inventors: Zongtao Zhou, Shanghai (CN); Chengsheng Huang, Dongguan (CN)

(73) Assignee: CollTech (Dongguan) Bonding Technology Co., Ltd., Dongguan (CN)

( * ) Notice: Subject to any disclaimer, the term of this patent is extended or adjusted under 35 U.S.C. 154(b) by 127 days.

(21) Appl. No.: 15/524,706

(22) PCT Filed: Oct. 23, 2015

(86) PCT No.: PCT/CN2015/092612
§ 371 (c)(1),
(2) Date: May 5, 2017

(87) PCT Pub. No.: WO2016/070722
PCT Pub. Date: May 12, 2016

(65) Prior Publication Data
US 2017/0342195 A1    Nov. 30, 2017

(30) Foreign Application Priority Data
Nov. 6, 2014   (CN) .......................... 2014 1 0620894

(51) Int. Cl.
*C08G 59/40*    (2006.01)
*C08J 3/24*     (2006.01)
(Continued)

(52) U.S. Cl.
CPC ............. *C08G 59/40* (2013.01); *C08J 3/24* (2013.01); *C08J 3/28* (2013.01); *C08L 63/00* (2013.01);
(Continued)

(58) Field of Classification Search
CPC .......... C08G 59/40; C09J 163/00; C08J 63/00
(Continued)

(56) References Cited

U.S. PATENT DOCUMENTS 4,985,340 A  * 1/1991 Palazzotto ............... C08F 2/50
                                                       430/270.1
5,672,549 A    9/1997 Katsunori et al.
(Continued)

FOREIGN PATENT DOCUMENTS

CN      1156329 A    8/1997
CN    101202252 A    6/2008
(Continued)

OTHER PUBLICATIONS

English abstract of CN 104387601.
(Continued)

*Primary Examiner* — Sanza L. McClendon
(74) *Attorney, Agent, or Firm* — Cahn & Samuels, LLP

(57) ABSTRACT

A method for instillation molding UV epoxy resin includes: the UV epoxy resin preparation step: adding at least two photosensitizers to a single component epoxy resin and uniformly mixing them to obtain the UV epoxy resin, wherein the photosensitizer with the highest content in the UV epoxy resin is a photosensitive curing agent for curing the UV epoxy resin, and the rest photosensitizers are photosensitive viscosity regulating agents for regulating the viscosity of the UV epoxy resin to be suitable for instillation molding; and instillation step: dividing the instillation molding of the UV epoxy resin into N procedures performed in one work station, wherein zero, one or more photosensitive viscosity regulating agents are initiated in each procedure, so that the UV epoxy resin reaches a viscosity suitable for respective instillation procedure and is subsequently instil-
(Continued)

lation molded; curing step: initiating the photosensitive curing agent to finally cure the UV epoxy resin.

16 Claims, 2 Drawing Sheets

(51) Int. Cl.
*C08J 3/28* (2006.01)
*C08L 63/00* (2006.01)
*C09J 163/00* (2006.01)
*H01L 23/28* (2006.01)
*H01L 21/56* (2006.01)
*H01L 23/29* (2006.01)

(52) U.S. Cl.
CPC ............ *C09J 163/00* (2013.01); *H01L 21/56* (2013.01); *H01L 23/28* (2013.01); *H01L 23/293* (2013.01); *H01L 2224/48095* (2013.01); *H01L 2924/0002* (2013.01); *H01L 2924/181* (2013.01)

(58) Field of Classification Search
USPC ........................................................ 522/170
See application file for complete search history.

(56) References Cited

U.S. PATENT DOCUMENTS

| | | | |
|---|---|---|---|
| 7,592,376 B2* | 9/2009 | Crivello | C08G 59/18 522/15 |
| 7,964,248 B2* | 6/2011 | Fong | C07C 381/12 427/466 |
| 2007/0235127 A1 | 10/2007 | Kuczynski | |

FOREIGN PATENT DOCUMENTS

| | | |
|---|---|---|
| CN | 104387601 A | 3/2015 |
| JP | S62226634 A | 10/1987 |
| JP | H0969591 A | 3/1997 |

OTHER PUBLICATIONS

English abstract of CN 1156329.
English abstract of JP S62226634.
English abstract of CN 101202252.
English Abstract of JPH0969591, dated Mar. 11, 1997.
Liebler et al., "Reliability Evaluation of Components for the Chip on Board (CoB) Technology in Sapce Application", European Space Agency Special Publications, Nov. 2002, pp. 11-15 (1-5).
English Translation of Written Opinion, dated Jan. 28, 2016.

* cited by examiner

UV EPOXY RESIN INSTILLATION MOLDING METHOD AND APPLICATION THEREOF

This U.S. patent application is a national stage application of PCT/CN2015/092612 filed on 23 Oct. 2015 and claims priority of Chinese patent document 201410620894.4 filed on 6 Nov. 2014, the entireties of which are incorporated herein by reference.

TECHNICAL FIELD

The present invention relates to a method for instillation molding (drip molding) of a UV epoxy resin. Said method can be used in the fields of microelectronic chip packaging, 3D printing and so on.

BACKGROUND OF THE INVENTION

So far, instillation molding of a UV epoxy resin is mainly used in the fields of microelectronic chip packaging, 3D printing and so on. The microelectronic chip packaging adopts mainly two types of packaging technology. One is molded packaging, such as DIP (Dual In-line Package), QFN (Quad Flat No-lead package), etc. This type of packaging technology is achieved by injection molding-curing of the modified epoxy resin in a mold under high temperature and pressure. The other type is instillation packaging using a UV epoxy resin or a thermosetting epoxy resin, which is used for COB (Chip-On-Board package). Currently, the commonly used epoxy resin instillation molding packaging usually works with a UV epoxy resin having a viscosity of 3000~6000 m·Pa·s, which are instillation molded by curing to afford the finished product as shown in FIG. 1. The microelectronic chip 1 on the top panel of the substrate 3 and the internal interconnector 2 are packaged within the package base body 5, said package base body 5 takes a form of a flattened hemisphere. Packaging process using the above type of instillation molding method has difficulty in controlling the boundary dimension and thickness of the package base body 5 after instillation molding, leaving a very thin layer of package over the area of internal interconnector 2 at the boundary of the package base body 5. This difficulty is caused by the fact that the UV epoxy resin is subjected to UV radiation for curing after said UV epoxy resin is coated or instillation molded when employing said UV epoxy resin for packaging. For such a process, the packaging dimension and thickness of the package base body 5 is determined to a large extent by the viscosity of the fluid UV epoxy resin before curing and the specific instillation molding procedures.

For products, which highly demand the thickness and packaging dimension of the package base body 5, UV epoxy resins with different viscosities are employed. Besides, the instillation molding procedures are performed in different work stations to meet different process- and quality-requirement. For example, the packaging of the COB modules, such kind of products demands strict control of the packaging dimension. More than ten years ago, said control was already achieved through instillation molding of two UV epoxy resins having different viscosities respectively in two different work stations. This method is currently still in use. Said method achieves good control of the packaging dimension and thickness of the package base body 5, however has the deficiencies of complex process procedures, considerable higher cost, and complex equipment and controlling system.

SUMMARY OF THE INVENTION

It is an object of the present invention to overcome the deficiencies of the prior art and to provide a method for instillation molding of a UV epoxy resin, which is capable of ensuring the surface smoothness of the instillation molded article, while ensuring the boundary dimension and thickness of the instillation molded article. At the same time, it is simple to operate.

One technical solution for achieving the above object is a method for instillation molding of epoxy resin, comprising the following steps:

the UV epoxy resin preparation step: adding at least two photosensitizers to a single component epoxy resin and uniformly mixing them to obtain the UV epoxy resin, wherein the photosensitizer with the highest content in said UV epoxy resin is a photosensitive curing agent for curing said UV epoxy resin, and the rest photosensitizers are photosensitive viscosity regulating agents for regulating the viscosity of said UV epoxy resin to be suitable for instillation molding; and instillation step: dividing the instillation molding of the UV epoxy resin into N procedures performed in one work station, wherein zero, one or more photosensitive viscosity regulating agents are initiated in each procedure, so that said UV epoxy resin reaches a viscosity suitable for respective instillation procedure and is subsequently instillation molded; and curing step: initiating said photosensitive curing agent to finally cure said UV epoxy resin.

Furthermore, the main absorption peaks of any two of the photosensitive viscosity regulating agents in said UV epoxy resin are separated from each other, and the main absorption peak of any one of the photosensitive viscosity regulating agents and the main absorption peak of said photosensitive curing agent in said UV epoxy resin are separated from each other.

Even further, said photosensitive viscosity regulating agent is initiated by irradiation using monochromatic sources having a spectral range of emission wavelength corresponding to the main absorption peak of said photosensitive viscosity regulating agent.

Ever further, upon regulating the viscosity of said UV epoxy resin by initiating any of the photosensitive viscosity regulating agents in said UV epoxy resin, the viscosity of said UV epoxy resin is determined by the emission power and the irradiation time of the monochromatic source having a spectral range of emission wavelength corresponding to the main absorption peak of said photosensitive viscosity regulating agent.

Furthermore, the initiation of said photosensitive viscosity regulating agents and the viscosity regulation of said UV epoxy resin are carried out during and/or after finishing any one of the procedures of the instillation step.

Furthermore, in any procedure from the second procedure on, the viscosity of said UV epoxy resin is regulated to the required procedure on the basis of the viscosity achieved in the proceeding procedure, or is regulated to the required procedure starting again from the base viscosity.

Furthermore, said curing step is carried out exclusively after all procedures in the instillation step are finished, or is carried out after M procedures in the instillation step, including the last procedure, are finished, wherein M≤N.

Furthermore, said photosensitive agents are radical form of photosensitive agents or cationic form of photosensitive agents.

Use of the above method for instillation molding of a UV epoxy resin is for microelectronic packaging or 3D printing.

A technical solution employing the method for instillation molding of a UV epoxy resin according to the present invention is a UV epoxy resin instillation molding method for adding a photosensitive curing agent and at least one photosensitive viscosity regulating agent to a single component epoxy resin, an then dividing the instillation molding step of the UV epoxy resin into N procedures to be carried out in one work station, wherein zero, one or more photosensitive viscosity regulating agents are initiated in each procedure, so that said UV epoxy resin reaches a viscosity suitable for respective procedure and is subsequently instillation molded, and subsequently initiating said photosensitive curing agent to finally cure the UV epoxy resin. The technical effect of said method is ensuring the surface smoothness of the instillation molded article and the excellent bonding between the interfaces of individual instillation molding procedures, while at the same time ensuring the boundary dimension and thickness of said instillation molded article. At the same time, it is simple to operate.

DETAILED DESCRIPTION

Figure 1:
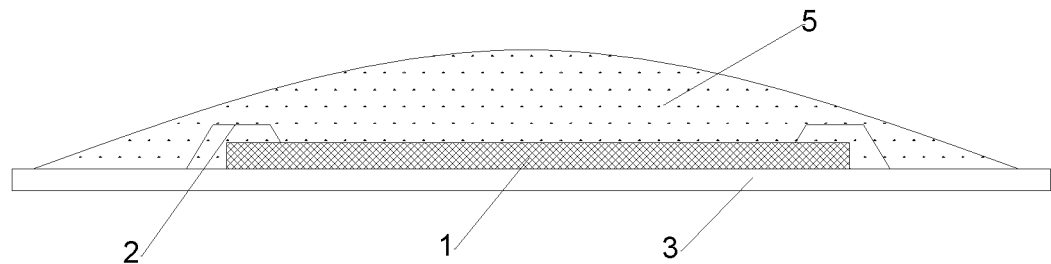
FIG. 1 Schematic drawing of the microelectronic chip package product in the prior art FIG. 2 Schematic drawing of the microelectronic chip package product using the inventive method for instillation molding of a UV epoxy resin FIG. 3 Schematic drawing of the viscosity variation curve of the UV epoxy resin according to the inventive method for instillation molding of a UV epoxy resin FIG. 4 Schematic drawing of the work station according to the inventive method for instillation molding of a UV epoxy resin FIG. 5 Schematic drawing of the main absorption peaks of a photosensitive viscosity regulating agent and a photosensitive curing agent according to the inventive method for instillation molding of a UV epoxy resin.

With reference to FIG. 1 to FIG. 5, the technical solution of the present invention is illustrated in details in combination with the following embodiments:

The inventive method for instillation molding of UV epoxy resin comprises the following steps:

UV Epoxy Resin Preparation Step

The inventive method for instillation molding of a UV epoxy resin, wherein the mechanism is: in the UV epoxy resin preparation step, two or more than two photosensitizers are added to a single component epoxy resin, and uniformly mixed to afford the UV epoxy resin, wherein the UV epoxy resin is characterized by controllable various viscosities. The photosensitizers employed in the UV epoxy resin comprise radical form of photosensitizers and cationic form of photosensitizers, wherein the photosensitizer with the highest content added in the UV epoxy resin is a photosensitive curing agent for finally curing the UV epoxy resin. Said photosensitive curing agent is generally inherent in the UV epoxy resin and is the only photosensitive curing agent. The mass ratio of said photosensitive curing agent to the single component epoxy resin is between 0.6~1.0. The rest photosensitizers are photosensitive viscosity regulating agents.

Instillation Step

According to the inventive method for instillation molding of a UV epoxy resin, the instillation step is divided into N procedures performed in one work station. In some of the procedures, one or more photosensitive viscosity regulating agents are initiated so that the UV epoxy resin is triggered for crosslinking reaction. Thus, the preceding viscosity of the UV epoxy resin is adjusted upwards to a viscosity required for said procedure. The amount of the added photosensitive viscosity regulating agents is much less than the added amount of photosensitive curing agent, wherein the mass ratio of any of the photosensitive viscosity regulating agent to the single component epoxy resin is generally smaller than 0.1. In initiating several photosensitive viscosity regulating agents, the contribution of each photosensitive viscosity regulating agent to increment of the viscosity of the UV epoxy resin is superimposed by multiplying.

In the inventive method for instillation molding of a UV epoxy resin, the initiation of any of the photosensitive viscosity regulating agent in the UV epoxy resin is carried out using light emitting diode (LED), UV light emitting diode (UVLED), or laser. As monochromatic sources, light emitting diodes, UV light emitting diodes, and lasers are all characterized by providing excellent monochromatic light, and thus the spectral range of the emission wavelength is narrow. Taking advantage of the LED, UVLED or laser emitting monochromatic light characterized by a narrow spectral range of the respective emission wavelength, the viscosity of the UV epoxy resin can be regulated by selecting photosensitive viscosity regulating agent having the corresponding main absorption peak and adjusting the content of said photosensitive viscosity regulating agent and setting the emission power of the corresponding monochromatic source.

The spectral range of the emission wavelength of each monochromatic source for controllable regulation of the viscosity of the UV epoxy resin can and must correspond to the main absorption peak of only one of the photosensitive viscosity regulating agents. Thus, the main absorption peak of a photosensitive viscosity regulating agents and the spectral range of the emission wavelength of a monochromatic source are one-to-one match, so that controllable regulation of the viscosity of the UV epoxy resin by irradiation using a monochromatic source is achievable, wherein initiations of different photosensitive viscosity agents are independent of each other. That means each monochromatic source having a characteristic spectral range of emission wavelength initiates only one photosensitive viscosity regulating agent. For the above reason, the main absorption peaks of any two photosensitive viscosity regulating agents added to the UV epoxy resin are separated from each other, namely, not overlapping with each other. Similarly, the main absorption peak of any photosensitive viscosity regulating agent does not overlap the main absorption peak of the photosensitive curing agent, namely, being separated from each other. This ensures that initiations of any two photosensitizers are independent of each other.

When the main absorption peak of a photosensitive viscosity regulating agent, more clearly the wavelength at which the absorbance within the spectral range of the absorption peak of the photosensitive viscosity regulating agent attains the maximum, falls into the spectral range of the emission wavelength of the monochromatic source, more clearly the main absorption peak of the photosensitive viscosity regulating agent corresponds to the spectral range of the emission wavelength of the monochromatic source, the controllable regulation of the viscosity of the UV epoxy resin can be achieved.

The appropriate monochromatic source for controllable regulation of the viscosity of a UV epoxy resin can be a laser or a light emitting diode (LED) and so on. The irradiation emitted by the monochromatic source can be ultraviolet spectrum or visible spectrum.

In any procedure from the second one on during the instillation step, there are two ways of controllable regulating the viscosity of the UV epoxy resin.

One way is to adjust upwards the viscosity of the UV epoxy resin to the value required for the following procedure starting from the viscosity required for the preceding procedure, namely, to further initiate one or more photosensitive viscosity regulating agents on the basis of initiation of the photosensitive viscosity regulating agent in the previous procedure, and hence to adjust further the viscosity of the UV epoxy resin to a viscosity required for the following procedure. That means the viscosity of the UV epoxy resin is adjusted upwards stepwise. The other way is to start anew from the base viscosity of the UV epoxy resin, namely to start anew from the base viscosity wherein none of the photosensitizers is initiated, alternatively expressed, to start anew from the lowest viscosity of the UV epoxy resin, and to adjust the viscosity to the viscosity required for the ongoing procedure. In practical use, the second way is dominant.

According to the inventive method for instillation molding of a UV epoxy resin, factors adjustable for achieving controllable regulation of the viscosity of the UV epoxy resin comprise the emission power of the monochromatic source, the content of the photosensitive viscosity regulating agents in the UV epoxy resin and the irradiation duration and so on.

Content of the photosensitive viscosity regulating agent: on condition that the spectral range of the emission wavelength of the monochromatic source corresponds to the main absorption peak of the photosensitive viscosity regulating agent, and that the emission power of the monochromatic source is constant, the increasing rate of the viscosity of the UV epoxy resin is proportional to the content of the photosensitive viscosity regulating agent.

Emission power of the monochromatic source: given the content of the photosensitive viscosity regulating agent being constant in the UV epoxy resin, the increasing rate of the viscosity of the UV epoxy resin is proportional to the corresponding emission power of the monochromatic source.

Figure 3:
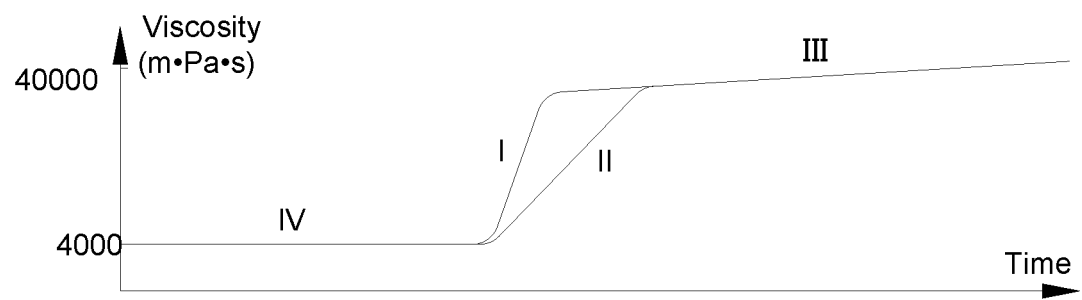

Given that the spectral range of the emission wavelength of the monochromatic source corresponds to the main absorption peak of the photosensitive viscosity regulating agent, namely, the main absorption peak of the photosensitive viscosity regulating agent is in the spectral range of the emission wavelength of the monochromatic source, and provided that the emission power of the monochromatic source reaches a particular value, the adjustment of the viscosity of the UV epoxy resin starting from the previous viscosity to a higher viscosity required in an ongoing procedure is finished instantaneously. This means the viscosity of the UV epoxy resin undergoes a stepped change as curve I of FIG. 3 shows. The maximum viscosity obtainable for the UV epoxy resin is proportional to the content of the photosensitive viscosity regulating agent, of which the main absorption peak corresponds to the spectral range of the emission wavelength of the monochromatic source. On the other hand, if the monochromatic source having the spectral range of emission wavelength corresponding to the main absorption peak works at an emission power below a particular value, the viscosity of the UV epoxy resin increases gradually with the time, namely, the function, according to which the output variable, the viscosity of the UV epoxy resin, correlates the input variable, the time, is a linear function as represented by curve II in FIG. 3. The even higher attainable viscosity of the UV epoxy resin required for the procedure is shown as curve II in FIG. 3. Upon regulating the viscosity of the UV epoxy resin, in the absence of monochromatic source to initiate any photosensitive viscosity regulating agent or photosensitive curing agent in the UV epoxy resin, the UV epoxy resin has a viscosity equal to the base viscosity of the normal single component UV epoxy resin. Alternatively expressed, as long as the monochromatic source for initiating any of the photosensitive viscosity regulating agents in the UV epoxy resin, and hence regulating the viscosity of the UV epoxy resin keeps switched off, the UV epoxy resin will keep unchanged at a certain viscosity, namely the base viscosity, before curing as curve III in FIG. 3 shows.

As to setting the content of each photosensitive viscosity regulating agents in the UV epoxy resin and the emission power of the monochromatic source for initiating respective photosensitive viscosity regulating agent, so that the viscosity of the UV epoxy resin reaches a viscosity required for the following procedure, they are to be experimentally determined. That is to say, it is to determine experimentally the viscosity of the UV epoxy resin after exposure to radiation of one or more emission wavelengths using monochromatic sources and to set the content of the photosensitive viscosity regulating agents on the basis of the determined viscosity, and the emission power of and emission time for the corresponding monochromatic source, so that the viscosity of the UV epoxy resin after exposure to monochromatic source meets the requirement for the viscosity of the UV epoxy resin in a particular procedure. Viscosity determination of a UV epoxy resin can be carried out according to the following prescriptions: firstly DIN EN ISO 3219-1994, secondarily GB/T 2794-1995 (Chinese national standards), and thirdly ASTM D445-1971.

Figure 4:
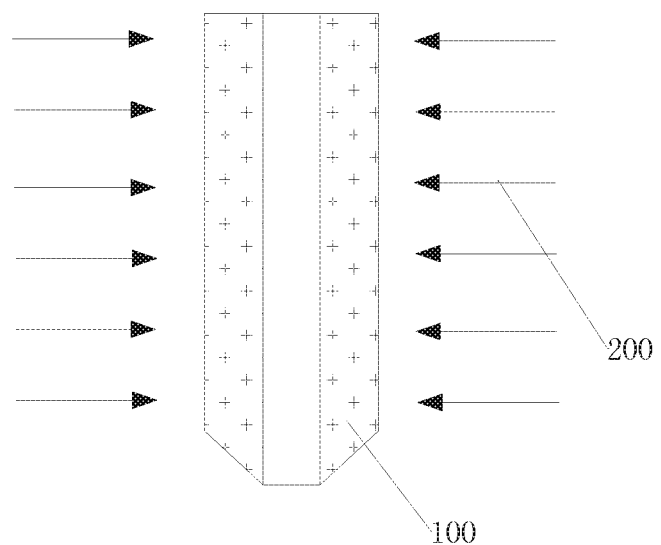

As shown in FIG. 4, the inventive method for instillation molding of a UV epoxy resin can be carried out in the following work station. Said work station comprises a instillation molding chamber (not shown in the Fig.) for keeping the UV epoxy resin and instillation tube 100 vertically connected with said instillation chamber, wherein the instillation chamber is opaque to ensure that any photosensitizer in the UV epoxy resin will not be initiated within said chamber. The instillation tube 100 is transparent. The monochromatic source 200, having its spectral range of emission wavelength corresponding to the respective main absorption bands of the photosensitive viscosity regulating agents, is arranged to surround the external wall of said instillation tube 100. The monochromatic source can be light emitting diode (LED) emitting visible light or ultraviolet light emitting diode (UVLED) emitting ultraviolet light, or a laser emitting lasers.

Monochromatic sources 200 are arranged on the external wall of the instillation tube 100 and are arranged in columns around the external wall of the instillation tube 100. Each column of monochromatic sources 200 comprises multiple monochromatic sources arranged vertically on the external wall of the instillation tube 100 and having the same spectral range of emission wavelength. The main absorption peak of each photosensitive viscosity regulating agent in the UV epoxy resin corresponds to the spectral range of emission wavelength of at least one column of monochromatic sources 200 on the instillation tube 100. The main absorption peak of each photosensitive viscosity regulating agent in the UV epoxy resin corresponds to the spectral range of emission wavelength of at least one column of monochromatic sources 200 arranged on the instillation tube 100. The emission power of each monochromatic source 200 on the external wall of the instillation tube 100 can be adjusted without grades between zero and the rated power, so that the emission power and radiation time of the monochromatic sources 200 exerted on the UV epoxy resin can be controlled. That is to say, the time needed for the UV epoxy resin to flow out of the instillation tube 100 and the exposure time to the monochromatic sources 200 can be controlled by switching on the monochromatic sources 200 radiating at different positions on the instillation tube 100, which have the spectral range of emission wavelength corresponding to the main absorption peak of the photosensitive viscosity regulating agent, which is to be initiated. For example, if the viscosity of the UV epoxy resin is to be instantaneously set to a viscosity needed for a procedure, it is only needed to switch on the monochromatic sources 200 at the bottom of the external wall of the instillation tube 100. If extension of the exposure time of the UV epoxy resin to monochromatic sources 200 becomes necessary, it is only needed to switch on the monochromatic sources 200 arranged at the bottom of the instillation tube 100 and/or at other corresponding positions on the instillation tube 100. When the UV epoxy resin flows through the instillation tube 100, monochromatic sources 200 at appropriate positions, of which the spectral range of the emission wavelength corresponds to the main absorption peak of the to be initiated viscosity regulating agent in the UV epoxy resin, are selectively switched on, so that the viscosity of the UV epoxy resin in the instillation tube 100 increases in a controllable way. Surely, control of the irradiation time of the monochromatic sources 200 can also be achieved by sealing the bottom of the instillation tube 100 and switching on one or more columns of monochromatic sources 200 having spectral range of emission wavelength corresponding to the main absorption peak of the photosensitive viscosity regulating agents to be initiated, and radiating for a certain time followed by switching off all the monochromatic sources 200. It is of course necessary to determine experimentally how to choose the appropriate positions on the instillation tube 100 and which appropriate monochromatic sources 200 are to choose.

Besides, what also determines the exposure time of the UV epoxy resin to the radiation of the monochromatic source 200 is the pressure exerted on the UV epoxy resin within said instillation chamber. The higher pressure the UV epoxy resin in said instillation chamber is subjected to, the faster the flowing rate of the UV epoxy resin is in the instillation tube 100, and hence the shorter the dwell-time. It follows that time of exposure to the monochromatic source 200 is shorter. Otherwise, the slower the flowing rate of the UV epoxy resin in the instillation tube 100, the longer the dwell-time becomes. It follows that the exposure time to the monochromatic source 200 is longer Upon determining viscosity of the UV resin in order to determine the type, the content of the photosensitive viscosity regulating agent, and the emission power and irradiation time of the monochromatic source, the sample, of which the viscosity is to be determined, is a UV epoxy resin sample, which has been subjected to radiation by all monochromatic sources 200 switched-on, and which flows out of the instillation tube 100. For example, after switching on monochromatic sources 200 located at the half-length of the instillation tube 100, the sample, of which the viscosity is to be experimentally determined, is the sample located above the monochromatic sources 200 at the time of switching on said monochromatic sources 200. Since the monochromatic sources 200 lead to increasing of the viscosity of the UV epoxy resin and to slowing down of the flow in the instillation tube 100, time needed to flow out of the instillation tube 100 for the UV epoxy resin, which is not suitable for viscosity determination, and time needed to flow out of the instillation tube 100 for the UV epoxy resin, which is suitable for the viscosity determination, are different. That is to say, the sample suitable for viscosity determination experiment must be the UV epoxy resin which is located above the topmost switched on monochromatic source.

In each procedure, regulation of the viscosity of the UV epoxy resin can be carried out just during the instillation step, namely before the UV epoxy resin flows out of the instillation tube 100, at this moment, the UV epoxy resin being in a state of viscos fluid. Alternatively, regulation of the viscosity of the UV epoxy resin can also be carried out after the instillation step is finished, namely after the UV epoxy resin flows out of the instillation tube 100, or carried out stepwise during and after the instillation step, wherein regulation after the UV epoxy resin flows out of the instillation tube 100 serves transforming the UV epoxy resin from viscous fluid state to gel state, alternatively expressed, gelatinizing the UV epoxy resin.

Curing Step

The curing step follows after the instillation step is finished. The curing-molding of the UV epoxy resin is accomplished by adequate radiation using monochromatic sources having the spectral range of its emission wavelength corresponding to the main adsorption peak of the photosensitive curing agent. The curing step can be carried out after all procedures of the instillation step are finished. For example, the curing step can be finally carried out in the curing furnace after all procedures are finished in the case of application in microelectronic chip packaging. Alternatively, it can also be carried out after M procedures in the instillation step, inclusive the last one, are finished, wherein M≤N.

In the following, an example of use of the UV epoxy resin comprising only one photosensitive viscosity regulating agent in microelectronic chip packaging is illustrated.

Figure 5:
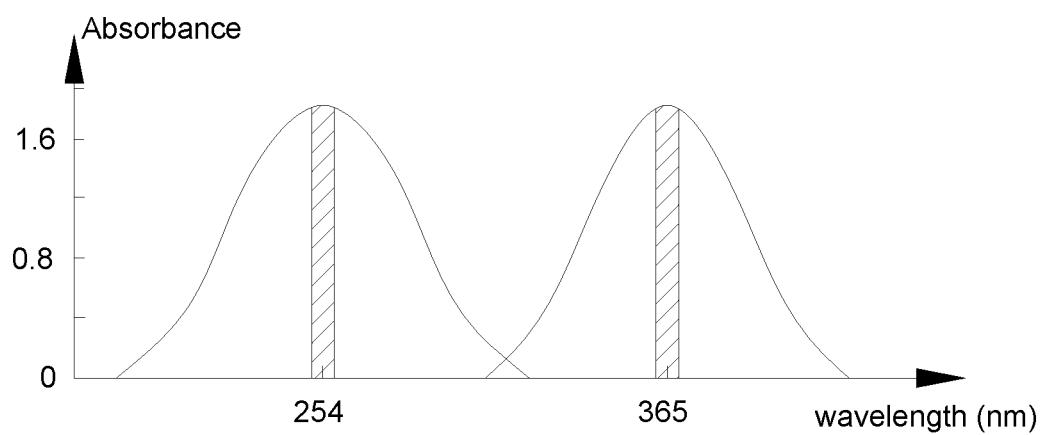

UV Epoxy Resin Preparation Step:

In this step, the photosensitive viscosity-regulating agent added to the single component epoxy resin has the main absorption peak at 254 nm, while the photosensitive curing agent has the main absorption peak at 365 nm. In general, monochromatic light with its wavelength corresponding to the main absorption peak of the photosensitive curing agent has a strong penetrability. For example, monochromatic light with wavelength of 365 nm is strongly penetrating and facilitating the final curing of the product. The further the main absorption peak of the photosensitive viscosity regulating agent and the main absorption peak of the photosensitive curing agent are separated from each other, the better the outcome of the viscosity regulation of the UV epoxy resin is. FIG. 5 is a schematic representation of the main absorption peaks of the photosensitive viscosity regulating agent and the photosensitive curing agent of the example, wherein the shading areas indicate the spectral ranges of the emission wavelengths of the monochromatic sources respectively initiating the photosensitive viscosity regulating agent and the photosensitive curing agent. The positions of the main absorption peaks of the photosensitive viscosity regulating agents and the photosensitive curing agent can exchange as well.

Herein, the photosensitive viscosity regulating agent is a photosensitizer capable of adjusting the viscosity of the UV epoxy resin from the base viscosity to the required high viscosity through controllable regulation. The amount added in the UV epoxy resin corresponds to the emission power of the monochromatic source, wherein the spectral range of the emission wavelength corresponds to the main absorption peak of that photosensitive viscosity regulating agent, to achieve the required viscosity for the procedure. Controlling of the changeable viscosity is a controlled switching process starting from base viscosity to higher viscosity or even higher viscosity. As shown in FIG. 4, the schematic representation of the work station shows that the viscosity of the UV epoxy resin is typical for a viscous fluid. The UV epoxy resin at the area which is not exposed to monochromatic source 200 keeps its base viscosity or previous viscosity as it was. This means switch from higher viscosity to lower viscosity can be dynamically achieved by switching off the monochromatic source 200.

Figure 2:
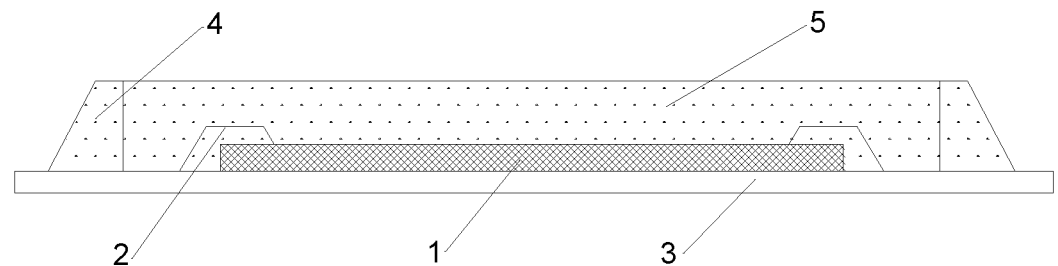

Instillation Step:

Schematic representation FIG. 2 indicates the packaging frame 4 surrounding the microelectronic chip 1, and the package base body 5 being on the inner side of the packaging frame 4. The packaging frame 4 and package base body 5 together comprise the package, namely, the instillation molded article. Said instillation molded article packages the microelectronic chip 1 on the top panel of the substrate 3 and the internal interconnector 2 inside the package.

Therefore, the instillation step can be divided into two procedures. In the first procedure, the packaging frame 4 for controlling the boundary dimensions is instillation molded. In the second procedure, the package base body 5 is packaged-molded.

The inventive method for instillation molding of a UV epoxy resin employs a work station as schematically shown in FIG. 4. Under exposure to a radiation of light emitting diode (LED) having a spectral range of emission wavelength at 254 nm, the photosensitive viscosity regulating agent having its main absorption peak at 254 nm is initiated in the instillation tube, so that the UV epoxy resin instantaneously reaches the viscosity required for the procedure from the base viscosity, namely, reaches the viscosity required for the first procedure. Herein, the UV epoxy resin viscosity increases by one to two orders of magnitude of ten.

Before carrying out the second procedure, the UV epoxy resin previously exposed to radiation of light emitting diode or laser in instillation tube 100 is emptied. Thus, the UV epoxy resin in the instillation tube 100 has again the base viscosity. Subsequently the second instillation procedure is carried out to accomplish the instillation of the package base body 5.

Curing Step:

After both procedures of the whole instillation step are finished, the resulting workpiece subjected to the above instillation step is laid in a curing furnace to expose to radiation by a high-pressure mercury lamp. Said high-pressure mercury lamp is a broad-spectrum UV emitting apparatus containing radiations having a wavelength of 254 nm and 365 nm, respectively.

The inventive method for instillation molding of a UV epoxy resin is usually used in applications, in which two viscosities are required to be rather different. The viscosities of the two procedures can be distinct from each by one to two orders of magnitude of ten. It is easy to control the boundary dimension upon increasing the viscosity of the UV epoxy resin. Upon decreasing the viscosity of the UV epoxy resin, the UV resin has a good fluidity, which promotes the instillation packaging or 3D printing speed while providing smooth surfaces.

According to the inventive method for instillation molding of a UV epoxy resin, during the instillation step, the viscosity of the UV epoxy resin can be dynamically adjusted from lower viscosity to higher viscosity, or the viscosity of the UV epoxy resin can be dynamically switched from higher viscosity to lower viscosity. For applications which demand exact boundary dimensions, it is easier to achieve shearing from higher viscosity to low viscosity. It can be done simply by switching off the monochromatic source for regulating the viscosity of the UV epoxy resin.

According to the inventive method for instillation molding of a UV epoxy resin, the UV epoxy resin is based on the same single component UV epoxy resin. For this reason, the instillation molded article made from the UV epoxy resin at a high viscosity, namely the packaging frame 4, and the instillation molded article made from the UV epoxy resin at a low viscosity, namely the package base body 5, retain an excellent uniformity and substantial interfacial bonding at the interface after curing.

A person of ordinary skill should keep in mind that the above embodiments serve merely the purpose of illustrating the present invention, while not limiting the present invention. Within the essence of the present invention, any variation and modification should be considered to fall into the scope of the present invention.

The invention claimed is:

1. A method for instillation molding of a UV epoxy resin, comprising the following steps:

the UV epoxy resin preparation step: adding at least two photosensitizers to a single component epoxy resin and uniformly mixing them to obtain the UV epoxy resin, wherein the photosensitizer with the highest content in said UV epoxy resin is a photosensitive curing agent for curing said UV epoxy resin, and the rest photosensitizers are photosensitive viscosity regulating agents for regulating the viscosity of said UV epoxy resin to be suitable for instillation molding; and instillation step: dividing the instillation molding of the UV epoxy resin into N procedures performed in one work station, wherein zero, one or more photosensitive viscosity regulating agents are initiated in each procedure, so that said UV epoxy resin reaches a viscosity suitable for respective instillation procedure and is subsequently instillation molded; and curing step: initiating said photosensitive curing agent to finally cure said UV epoxy resin wherein the main absorption peaks of any two of the photosensitive viscosity regulating agents in said UV epoxy resin are separated from each other, and that the main absorption peak of any one of the photosensitive viscosity regulating agents and the main absorption peak of said photosensitive curing agent in said UV epoxy resin are separated from each other, and wherein said photosensitive viscosity regulating agent is initiated by irradiation using monochromatic sources having a spectral range of emission wavelength corresponding to the main absorption peak of said photosensitive viscosity regulating agent.

2. The method for instillation molding of a UV epoxy resin according to claim 1, wherein, upon regulating the viscosity of said UV epoxy resin by initiating any of the photosensitive viscosity regulating agents in said UV epoxy resin, the viscosity of said UV epoxy resin is determined by the emission power and the irradiation time of the monochromatic source having a spectral range of emission wavelength corresponding to the main absorption peak of said photosensitive viscosity regulating agent.

3. The method for instillation molding of a UV epoxy resin according to claim 1, wherein the initiation of said photosensitive viscosity regulating agents and the viscosity regulation of said UV epoxy resin are carried out during and/or after finishing any one of the procedures of the instillation step.

4. The method for instillation molding of a UV epoxy resin according to claim 1, wherein, in any procedure from the second procedure on, the viscosity of said UV epoxy resin is regulated to the required one starting from the viscosity of the proceeding procedure, or is regulated to the required viscosity starting again from the base viscosity.

5. The method for instillation molding of a UV epoxy resin according to claim 1, wherein said curing step is carried out exclusively after all procedures in the instillation step are finished, or is carried out after M procedures in the instillation step, inclusive the last procedure, are finished, wherein M≤N.

6. The method for instillation molding of a UV epoxy resin according to claim 1, wherein said photosensitive agents are radical form of photosensitive agents or cationic form of photosensitive agents.

7. Use of the method for instillation molding of a UV epoxy resin according to claim 1 in microelectronic packaging or 3D printing.

8. A method for instillation molding of a UV epoxy resin, comprising:
adding at least two photosensitizers to a single component epoxy resin and uniformly mixing them to obtain the UV epoxy resin, wherein the photosensitizer with the highest content in said UV epoxy resin is a photosensitive curing agent for curing said UV epoxy resin, and the rest photosensitizers are photosensitive viscosity regulating agents for regulating the viscosity of said UV epoxy resin to be suitable for instillation molding;
dividing the instillation molding of the UV epoxy resin into N procedures performed in one work station, wherein zero, one or more photosensitive viscosity regulating agents are initiated in each procedure, so that said UV epoxy resin reaches a viscosity suitable for respective instillation procedure and is subsequently instillation molded; and
initiating said photosensitive curing agent to finally cure said UV epoxy resin,
wherein, in any procedure from a second procedure on, a viscosity of said UV epoxy resin is regulated to a required viscosity starting from the viscosity of the proceeding procedure, or is regulated to a required viscosity starting again from a base viscosity.

9. A method of microelectronic packaging comprising molding a package frame and molding a package base body by a method for instillation molding of a UV epoxy resin, said method for instillation molding comprising the following steps:
the UV epoxy resin preparation step: adding at least two photosensitizers to a single component epoxy resin and uniformly mixing them to obtain the UV epoxy resin, wherein the photosensitizer with the highest content in said UV epoxy resin is a photosensitive curing agent for curing said UV epoxy resin, and the rest photosensitizers are photosensitive viscosity regulating agents for regulating the viscosity of said UV epoxy resin to be suitable for instillation molding; and
instillation step: dividing the instillation molding of the UV epoxy resin into N procedures performed in one work station, wherein zero, one or more photosensitive viscosity regulating agents are initiated in each procedure, so that said UV epoxy resin reaches a viscosity suitable for respective instillation procedure and is subsequently instillation molded; and
curing step: initiating said photosensitive curing agent to finally cure said UV epoxy resin
wherein the main absorption peaks of any two of the photosensitive viscosity regulating agents in said UV epoxy resin are separated from each other, and that the main absorption peak of any one of the photosensitive viscosity regulating agents and the main absorption peak of said photosensitive curing agent in said UV epoxy resin are separated from each other, and
wherein said photosensitive viscosity regulating agent is initiated by irradiation using monochromatic sources having a spectral range of emission wavelength corresponding to the main absorption peak of said photosensitive viscosity regulating agent.

10. The method for instillation molding of a UV epoxy resin according to claim 1, wherein, in any procedure from the second procedure on, the viscosity of said UV epoxy resin is regulated to the required one starting from the viscosity of the proceeding procedure and adjusting the viscosity upwards stepwise.

11. The method for instillation molding of a UV epoxy resin according to claim 1, wherein, in any procedure from the second procedure on, the viscosity of said UV epoxy resin is regulated to the required viscosity starting again from the base viscosity of the UV epoxy resin.

12. The method for instillation molding of a UV epoxy resin according to claim 1, wherein the curing step is carried out after all N procedures of the instillation step.

13. The method for instillation molding of a UV epoxy resin according to claim 1, wherein the work station comprises a transparent instillation tube.

14. The method for instillation molding of a UV epoxy resin according to claim 1, wherein one or more photosensitive agents are initiated in said instillation step.

15. The method for instillation molding of a UV epoxy resin according to claim 8, wherein, in any procedure from the second procedure on, the viscosity of said UV epoxy resin is regulated to the required one starting from the viscosity of the proceeding procedure and adjusting the viscosity upwards stepwise.

16. The method for instillation molding of a UV epoxy resin according to claim 8, wherein, in any procedure from the second procedure on, the viscosity of said UV epoxy resin is regulated to the required viscosity starting again from the base viscosity of the UV epoxy resin.

* * * * *